US011502232B2

(12) United States Patent
Wu et al.

(10) Patent No.: US 11,502,232 B2
(45) Date of Patent: Nov. 15, 2022

(54) PIXEL STRUCTURE

(71) Applicant: Industrial Technology Research Institute, Hsinchu (TW)

(72) Inventors: Ming-Hsien Wu, Hsinchu County (TW); Yao-Jun Tsai, Taoyuan (TW)

(73) Assignee: Industrial Technology Research Institute, Hsinchu (TW)

( * ) Notice: Subject to any disclaimer, the term of this patent is extended or adjusted under 35 U.S.C. 154(b) by 16 days.

(21) Appl. No.: 16/928,019

(22) Filed: Jul. 14, 2020

(65) Prior Publication Data
US 2021/0193891 A1 Jun. 24, 2021

(30) Foreign Application Priority Data
Dec. 24, 2019 (TW) .................................. 108147470

(51) Int. Cl.
*H01L 33/62* (2010.01)
*H01L 33/00* (2010.01)
(Continued)

(52) U.S. Cl.
CPC .............. *H01L 33/62* (2013.01); *H01L 22/22* (2013.01); *H01L 25/0753* (2013.01); *H01L 33/0095* (2013.01)

(58) Field of Classification Search
CPC combination set(s) only.
See application file for complete search history.

(56) References Cited

U.S. PATENT DOCUMENTS 8,552,436 B2 10/2013 Bibl et al.
8,791,474 B1 7/2014 Bibl et al.
(Continued)

FOREIGN PATENT DOCUMENTS

| CN | 106206651 | 12/2016 |
| CN | 109003996 | 12/2018 |

(Continued)

OTHER PUBLICATIONS

"Office Action of Taiwan Counterpart Application", dated Jul. 23, 2020, p. 1-p. 6.

(Continued)

*Primary Examiner* — Ratisha Mehta
(74) *Attorney, Agent, or Firm* — JCIPRNET

(57) ABSTRACT

A pixel structure including a substrate, a first conductor, a second conductor, and a plurality of dies is provided. The first conductor is disposed on the substrate and includes a plurality of first body portions extending along a first direction, a plurality of first branch portions extending along a second direction, and a plurality of second branch portions extending along the first direction. The second conductor is disposed on the substrate and includes a plurality of second body portions extending along the second direction and a plurality of third branch portions extending along the first direction. The die includes two electrodes, wherein the first branch portions are connected between the first body portions and the second branch portions, and the two electrodes are respectively connected to the first branch portions and the second body portions or respectively connected to the second branch portions and the third branch portions.

15 Claims, 15 Drawing Sheets

(51) Int. Cl.
*H01L 21/66* (2006.01)
*H01L 25/075* (2006.01)

(56) References Cited

U.S. PATENT DOCUMENTS

| | | | |
|---|---|---|---|
| 8,809,875 | B2 | 8/2014 | Bibl et al. |
| 9,831,222 | B2 | 11/2017 | Lee et al. |
| 10,381,335 | B2 | 8/2019 | Sasaki et al. |
| 2006/0240578 | A1 | 10/2006 | Oohata et al. |
| 2012/0305954 | A1 | 12/2012 | Kim |
| 2013/0126891 | A1 | 5/2013 | Bibi et al. |
| 2015/0084054 | A1 | 3/2015 | Fan et al. |
| 2018/0159088 | A1 | 6/2018 | Lai et al. |
| 2018/0269328 | A1 | 9/2018 | Park |
| 2018/0323116 | A1 | 11/2018 | Wu et al. |
| 2018/0374828 | A1* | 12/2018 | Liao .............. H01L 25/167 |
| 2019/0081025 | A1 | 3/2019 | Chang et al. |
| 2019/0172761 | A1 | 6/2019 | Guo et al. |
| 2019/0229097 | A1 | 7/2019 | Takeya et al. |
| 2020/0111941 | A1* | 4/2020 | Xing .............. H01L 25/0753 |
| 2021/0151650 | A1* | 5/2021 | Wu .............. H01L 27/156 |

FOREIGN PATENT DOCUMENTS

| | | |
|---|---|---|
| TW | 200408308 | 5/2004 |
| TW | 201643843 | 12/2016 |
| TW | 201943067 | 11/2019 |

OTHER PUBLICATIONS

Pengfei Tian et al., "Size-dependent efficiency and efficiency droop of blue InGaN micro-light emitting diodes", Applied Physics Letters 101, 231110 (2012), Dec. 6, 2012, pp. 231110-231110-4.

Seongmo Hwang et al., "A Hybrid Micro-Pixel Based Deep Ultraviolet Light-Emitting Diode Lamp", Applied Physics Express 4 (2011) 012102, Dec. 16, 2010, pp. 012102-1-012102-3.

Bok Y. Ahn et al., "Omnidirectional Printing of Flexible, Stretchable, and Spanning Silver Microelectrodes", Science 323 (5921), Mar. 20, 2009, pp. 1590-1593.

Sang-Il Park et al, "Printed Assemblies of Inorganic Light-Emitting Diodes for Deformable and Semitransparent Displays", Science 325 (5943), Aug. 21, 2009,pp. 977-981.

Zheng Gong et al.,"Size-dependent light output, spectral shift, and self-heating of 400 nm InGaN light-emitting diodes", J. Appl. Phys. 107, 013103 (2010), Jan. 6, 2010, pp. 013103-013103-6.

\* cited by examiner

PIXEL STRUCTURE

CROSS-REFERENCE TO RELATED APPLICATION

This application claims the priority benefit of Taiwan application no. 108147470, filed on Dec. 24, 2019. The entirety of the above-mentioned patent application is hereby incorporated by reference herein and made a part of this specification.

TECHNICAL FIELD

The invention relates to a pixel structure, and in particular, to a pixel structure having a micro light emitting diode (Micro LED) die.

BACKGROUND

A micro light emitting diode (Micro LED) has advantages such as long service life, small size, high shock resistance, low heat generation, and low power consumption, and is applied to tablets and displays of small size currently. In recent years, the micro light emitting diodes have developed towards multi-color and high luminance. Therefore, in future applications, the micro light emitting diodes may be applied to more fields at different applications, and may even replace common light emitting diodes at present. However, in current development, a yield of production of pixel structures using micro light emitting diodes is still poor, resulting in waste of the micro light emitting diode dies. In addition, since a bonding material cannot be removed and reused when the micro light emitting diode is replaced, it is difficult to repair the pixel structure fabricated using the micro light emitting diode.

Therefore, in this case, it is currently a common practice to arrange two same micro light emitting diodes at different positions in a same pixel unit in the pixel structure. When the originally used micro light emitting diode is damaged, a standby micro light emitting diode can be directly used for further use. In other words, a space for two diodes is reserved at a same pixel position, and one of the placement space is a mounting position of a patch diode when patching the pixels. However, this practice makes the manufacturing process complicated and costs high. In addition, a large area is required for accommodating the repair diodes, and when the micro light emitting diodes at a number of positions need to be repaired, a display effect is easily affected and distorted. Therefore, it is a problem to be resolved by persons skilled in the art to reduce the reserved space for repair diodes and improve the display effect.

SUMMARY

The invention provides a pixel structure, which may save a cost for producing a large number of dies and maintain a consistent display effect before and after repair.

The invention provides a pixel structure, including a substrate, a first conductor, a second conductor, and a plurality of dies. The first conductor is disposed on the substrate, including a plurality of first body portions extending along a first direction, a plurality of first branch portions extending along a second direction, and a plurality of second branch portions extending along the first direction. The second conductor is disposed on the substrate, including a plurality of second body portions extending along the second direction and a plurality of third branch portions extending along the first direction. The die include two electrodes, where the first branch portions are connected between the first body portions and the second branch portions, and the two electrodes are respectively connected to the first branch portions and the second body portions or are respectively connected to the second branch portions and the third branch portions.

The invention provides another pixel structure, including a substrate, a first conductor, a second conductor, a plurality of first dies, and a plurality of second dies. The first conductor is disposed on the substrate, including first body portions extending along a first direction, a plurality of first branch portions extending along a second direction, and a plurality of second branch portions extending along the first direction. The second conductor is disposed on the substrate, including a plurality of second body portions extending along the second direction and a plurality of third branch portions extending along the first direction. The first die includes a first electrode pair connected to one of the first branch portions and one of the second body portions. The second die includes a second electrode pair connected to one of the second branch portions and one of the third branch portions.

Based on the foregoing, in the pixel structure of the invention, the first conductor includes a plurality of first body portions extending along a first direction, a plurality of first branch portions extending along a second direction, and a plurality of second branch portions extending along the first direction. The second conductor includes a plurality of second body portions extending along the second direction and a plurality of third branch portions extending along the first direction. Therefore, when dies in the pixel structure need to be repaired, by using a two-way extension design of the first conductor and the second conductor, an original die can be removed, and a repair die can be installed on the first conductor and the second conductor at the same position in another connection mode, so that a cost for producing a large number of dies is saved, and the display effect before and after repair remains consistent.

In order to make the aforementioned and other objectives and advantages of the invention comprehensible, embodiments are described in detail below with reference to the accompanying drawings.

DETAILED DESCRIPTION OF DISCLOSED EMBODIMENTS

Figure 1:
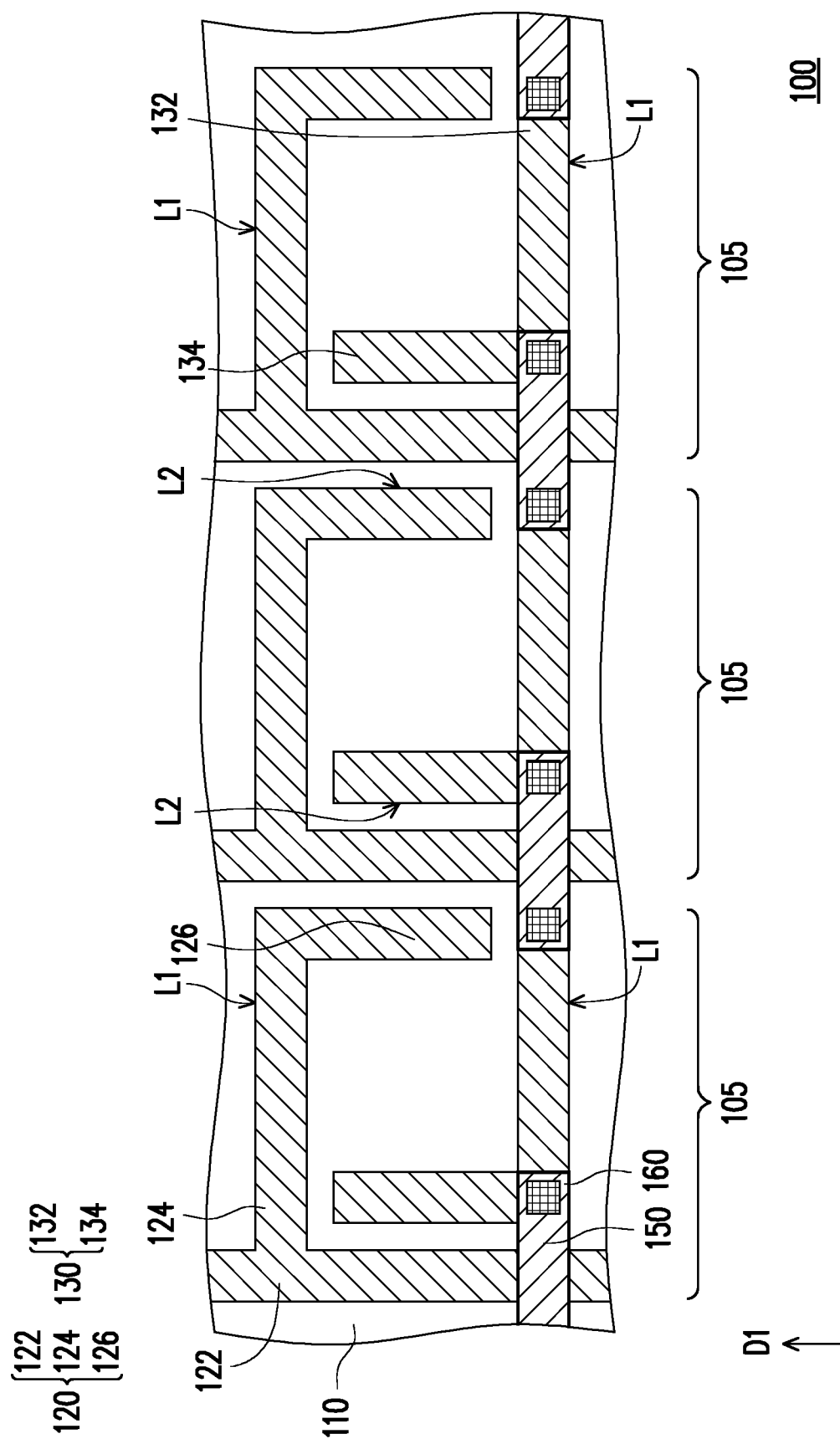
FIG. 1 is a schematic top view of part of a pixel structure according to an embodiment of the invention.

Embodiments of the invention are described below in detail with reference to the accompanying drawings. It should be understood that the accompanying drawings are only used for description and explanation, but not for limiting the invention. For clarity, elements may not be depicted to the actual scale. In addition, some elements and/or reference numerals may be omitted in some of the drawings. In the specification and drawings, the same or similar reference numerals are used to indicate the same or similar elements. When an element is described as being "disposed on" or "connected to" . . . another element, in cases that are not particularly limited, the element may be "directly disposed on" or "directly connected to" . . . another element, or there may also be intermediary elements. It may be expected that elements and features of one embodiment may, when feasible, be incorporated into another embodiment and bring benefits, which is not further described herein.

Figure 2:
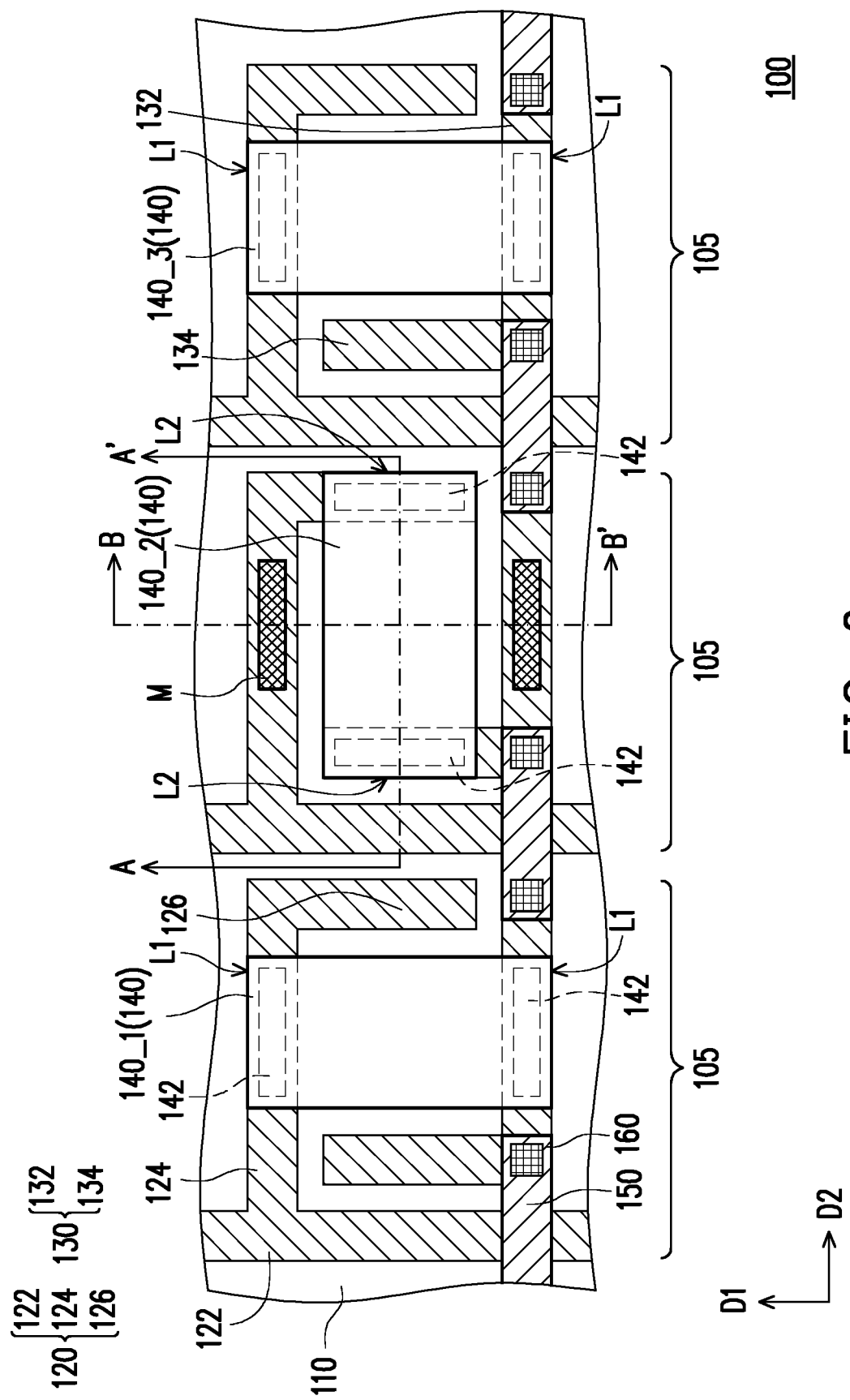
FIG. 2 is another schematic top view of part of the pixel structure in FIG. 1.
Figure 3A:
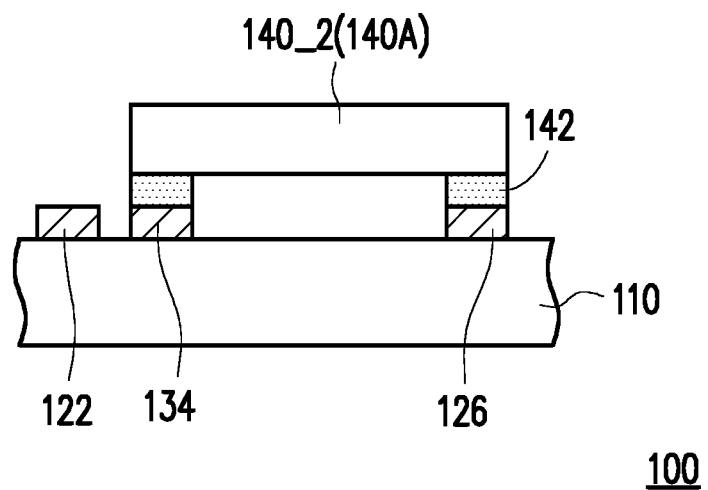
FIG. 3A and FIG. 3B are respectively schematic cross-sectional views of the pixel structure in FIG. 2 taken along line A-A' and line B-B'.
Figure 3B:
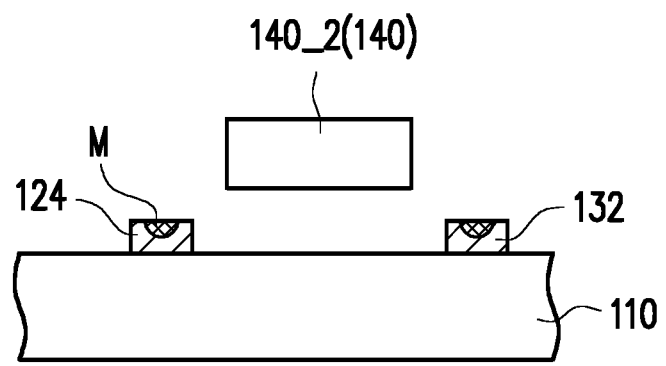

FIG. 1 is a schematic diagram of part of a pixel structure according to an embodiment of the invention. FIG. 2 is another schematic diagram of part of the pixel structure in FIG. 1. FIG. 3A and FIG. 3B are respectively schematic cross-sectional views of the pixel structure in FIG. 2 taken along line A-A' and line B-B'. Refer to FIG. 1 to FIG. 3B. This embodiment provides a pixel structure 100, including a substrate 110, a first conductor 120, a second conductor 130, and a plurality of dies 140. The first conductor 120 and the second conductor 130 are disposed on the substrate 110, and the plurality of dies 140 is disposed on the first conductor 120 and the second conductor 130. Specifically, the first conductor 120 and the second conductor 130 are, for example, circuit wires formed on the substrate 110, and respectively serve as signal lines (for example, scan lines and data lines) in different directions in the pixel structure 100. In this embodiment, the first conductor 120 and the second conductor 130 are located on the same layer of circuit structure, as depicted in FIG. 1, but the invention is not limited thereto.

The dies 140 are, for example, micro light emitting diodes. In this embodiment, the pixel structure 100 may be defined by a plurality of sub-pixel structures 105, and micro light emitting diodes of different wavelengths are disposed in neighboring sub-pixel structures 105. For example, in a neighboring region, a die 140_1 is, for example, a red micro light emitting diode, a die 140_2 is, for example, a green micro light emitting diode, and a die 140_3 is, for example, a blue micro light emitting diode. In other words, the pixel structure 100 of this embodiment comprises red, green, and blue sub-pixel structures 105, but the invention is not limited thereto. For convenience of illustration, only part of the pixel structure 100 is shown in FIG. 1 to FIG. 3B, but the number of the first conductors 120, the number of the second conductors 130, the number of the corresponding dies 140, and the size of the pixel structure 100 are not limited in the invention. In addition, the dies 140 are hidden in the pixel structure 100 in FIG. 1, and the dies 140 are shown in the pixel structure 100 in FIG. 2. In this embodiment, The dies 140 are rectangular, but in other embodiments, the dies 140 may be in other shapes, and the invention is not limited thereto.

Specifically, the first conductor 120 includes a plurality of first body portions 122 extending along a first direction D1, a plurality of first branch portions 124 extending along a second direction D2, and a plurality of second branch portions 126 extending along the first direction D1. The second conductor 130 includes a plurality of second body portions 132 extending along the second direction D2 and a plurality of third branch portions 134 extending along the first direction D1. In this embodiment, the first direction D1 is perpendicular to the second direction D2, but in other embodiments, the first direction D1 and the second direction D2 may also be inclined instead of perpendicular, and the invention is not limited thereto.

More specifically, in this embodiment, a plurality of first branch portions 124 extends from different positions on the first body portions 122 in the second direction D2, and the second branch portion 126 extends from one end of the first branch portions 124 and away from the first body portion 122 in the first direction D1. In other words, the first branch portion 124 is connected between the first body portion 122 and the second branch portion 126. On the other hand, the third branch portion 134 extends from one end of the second body portions 132 and away from the second branch portion 126 in the first direction D1, and the second branch portion 126 and the third branch portion 134 extend toward each other.

In this embodiment, the pixel structure 100 further includes a plurality of bridging portions 150, respectively connected between neighboring second body portions 132 in the second direction D2. The bridging portions 150 criss-cross the first body portions 122 and the bridging portions 150 are insulated from the first body portions 122. The bridging portions 150 and the second conductor 130 are located on different layers, but the invention is not limited thereto. In other words, the first conductor 120 and the second conductor 130 are located on a first layer (that is, a lower layer), and the bridging portions 150 are located on a second layer (that is, an upper layer). More specifically, the pixel structure 100 further includes a plurality of conductive through-holes 160, connected between the bridging portions 150 and the second body portions 132, and a dielectric protective layer may be disposed between the first layer and the second layer to electrically isolate the two layers. In other words, the conductive through-holes 160 connect the first layer and the second layer. It should be noted that in this embodiment and subsequent embodiments, the second layer is on the top of the first layer, but in other embodiments, the second layer may also be on the bottom of the first layer, and the invention is not limited thereto.

The die 140 includes two electrodes 142, and the two electrodes 142 are respectively connected to the first branch portions 124 and the second body portions 132, shown as the dies 140_1 and 140_3 in FIG. 2. Alternatively, the two electrodes 142 are respectively connected to the second branch portions 126 and the third branch portions 134, shown as the die 140_2 in FIG. 2. For example, in this embodiment, a length of the long side of the die 140_2 is, for example, equal to a distance between the first body portion 122 and the second branch portion 126, and a length of the long side of the dies 140_1 and 140_3 is, for example, equal to a distance between the first branch portion 124 and the second body portion 132.

In other words, the pixel structure 100 after repair includes a plurality of original first dies (that is, the dies 140_1 and 140_3) and a repair second die (that is, the die 140_2). The first dies and the second die are arranged side by side on the substrate 110, and the original second die and the repair second die have the same specification (for example, the same wavelength or size). The first die includes a first electrode pair connected to one of the first branch portions 124 and one of the second body portions 132 (for example, the two electrodes 142 of the die 140_1 or the two electrodes 142 of the die 140_3), and the second die includes a second electrode pair connected to one of the second branch portions 126 and one of the third branch portions 134 (for example, the two electrodes 142 of the die 140_2). In addition, connection residue M, for example, metal residue left during a die removal process, exists on the first branch portion 124 and the second body portion 132 that are adjacent to the second die, as shown in FIG. 2. If the original second die is originally connected to the second branch portion 126 and the third branch portion 134, the connection residue M after the die removal process exists on the second branch portion 126 and the third branch portion 134.

In this embodiment, an extension direction of the first electrode pair is, for example, parallel to an extension direction of the first branch portion 124 and an extension direction of the second body portion 132, and an extension direction of the second electrode pair is, for example, parallel to an extension direction of the second branch portion 126 and an extension direction of the third branch portion 134. The first electrode pair is disposed on a first pair of sides L1 of the first die, and the second electrode pair is disposed on a second pair of sides L2 of the second die, and the first pair of sides L1 are, for example, perpendicular to the second pair of sides L2. The first pair of sides L1 are, for example, parallel to the first branch portion 124 and the second body portion 132, and the second pair of sides L2 are, for example, parallel to the second branch portion 126 and the third branch portion 134, but the invention is not limited thereto. Therefore, when a die 140 in the pixel structure 100 needs to be repaired, by using a two directional extension design of the bridging portions 150, the first conductor 120 and the second conductor 130, the original die can be removed and the repair die can be installed on the first conductor 120 and the second conductor 130 at the same position in another connection method, so that a cost for producing a large number of dies is saved, and the display effect before and after repair remains consistent.

Figure 4:
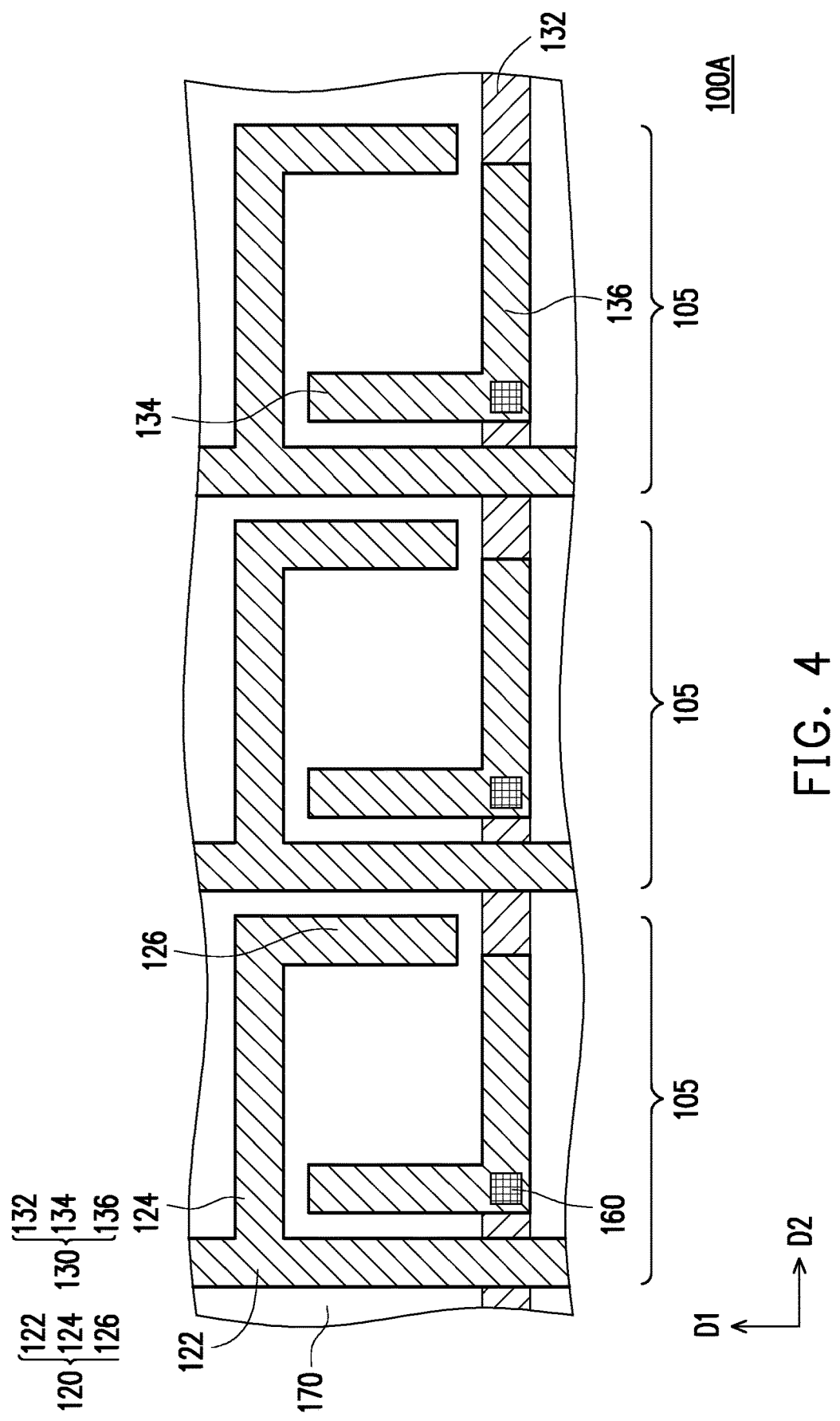
FIG. 4 is a schematic top view of part of a pixel structure according to another embodiment of the invention.
Figure 5:
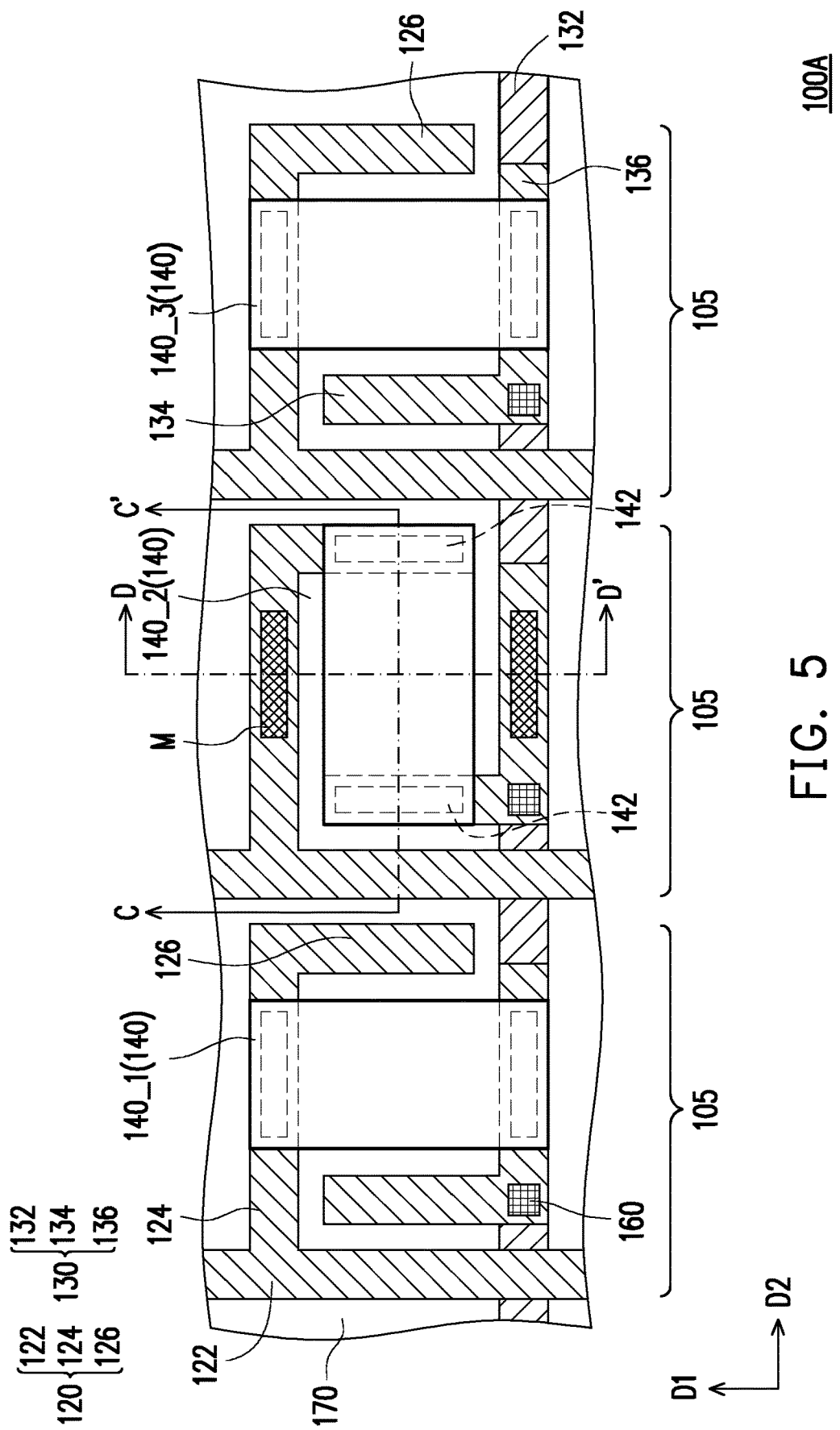
FIG. 5 is another schematic top view of part of the pixel structure in FIG. 4.
Figure 6A:
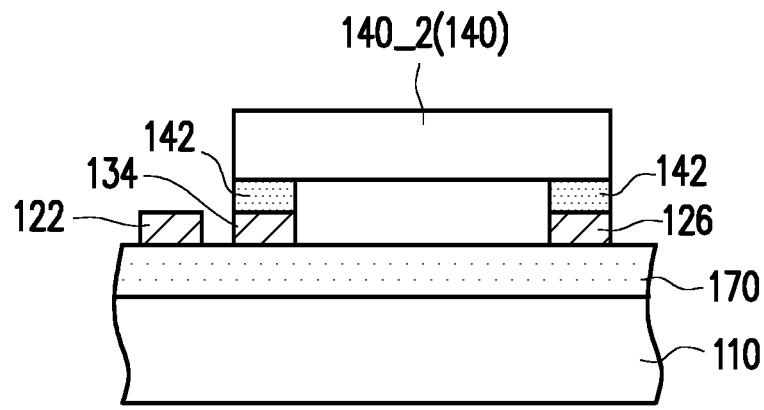
FIG. 6A and FIG. 6B are respectively schematic cross-sectional views of the pixel structure in FIG. 5 taken along line C-C' and line D-D'.
Figure 6B:
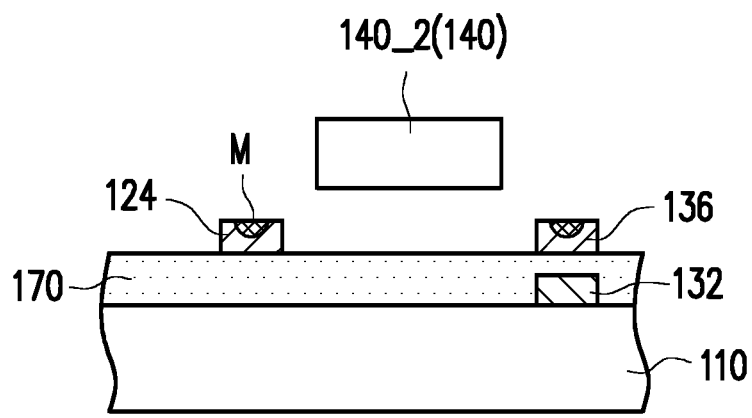

FIG. 4 is a schematic top view of part of a pixel structure according to another embodiment of the invention. FIG. 5 is another schematic top view of part of the pixel structure in FIG. 4. FIG. 6A and FIG. 6B are respectively schematic cross-sectional views of the pixel structure in FIG. 5 taken along line C-C' and line D-D'. Refer to FIG. 4 to FIG. 6B. The dies 140 are hidden in the pixel structure 100A in FIG. 4, and the dies 140 are shown in part of the pixel structure 100A in FIG. 5. The pixel structure 100A of this embodiment is similar to the pixel structure 100 shown in FIG. 2. The difference lies in that, in this embodiment, the first body portions 122, the first branch portions 124, and the second branch portions 126 of the first conductor 120 and the third branch portions 134 and the fourth branch portions 136 of the second conductor 130 are on the same layer (that is, the upper layer) of the circuit structure, and the second body portions 132 of the second conductor 130 are on the other layer (that is, the lower layer) of the circuit structure. In other words, in this embodiment, the first body portions 122, the first branch portions 124, and the second branch portions 126 of the first conductor 120 and the third branch portions 134 and the fourth branch portions 136 of the second conductor 130 are on the top of the second body portions 132 of the second conductor 130, and the second body portions 132 of the second conductor 130 are between the fourth branch portions 136 of the second conductor 130 and the substrate 110.

Specifically, in this embodiment, the plurality of third branch portions 134 of the second conductor 130 is electrically connected to the second body portions 132 through the conductive through-holes 160, and extends along the first direction D1 on the second layer (that is, on the same layer as the first conductor 120), and the second conductor 130 further includes a plurality of fourth branch portions 136 extending along the second direction D2, and the fourth branch portions 136 are connected to the third branch portions 134. More specifically, a dielectric protective layer 170 may be arranged to make the two layers of circuit structures, that is, the conductive structure located on the first layer and the conductive structure located on the second layer, electrically insulated. Therefore, when a die 140 in the pixel structure 100A needs to be repaired, by using a two-way extension design of the first conductor 120 and the second conductor 130, the original die 140 can be removed, and the repair die 140 (that is, the die 140_2 shown in FIG. 5) can be installed on the first conductor 120 and the second conductor 130 at the same position in another connection mode, so that a cost for producing a large number of dies is saved, and the display effect before and after repair remains consistent.

Figure 7:
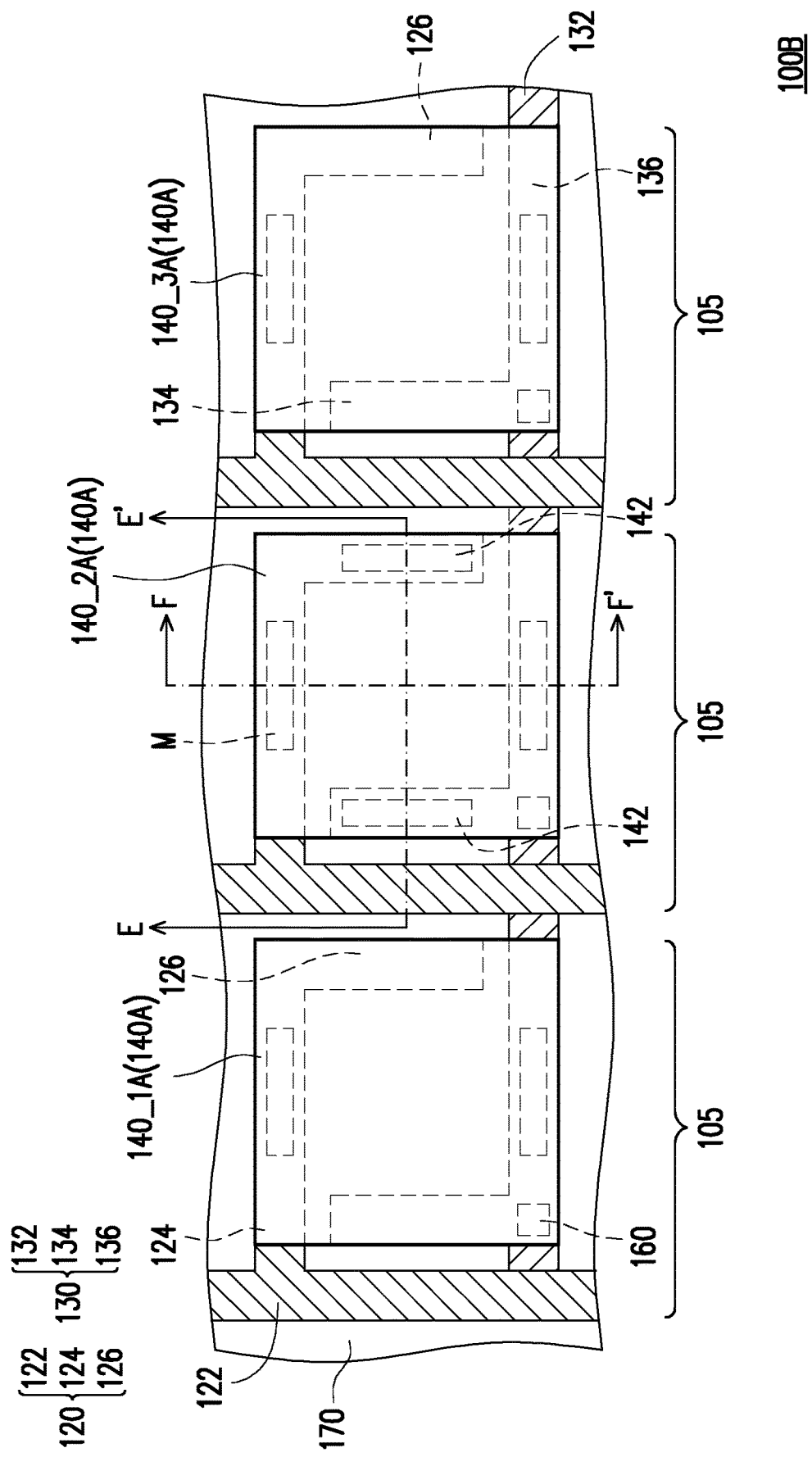
FIG. 7 is a schematic top view of part of a pixel structure according to still another embodiment of the invention.
Figure 8A:
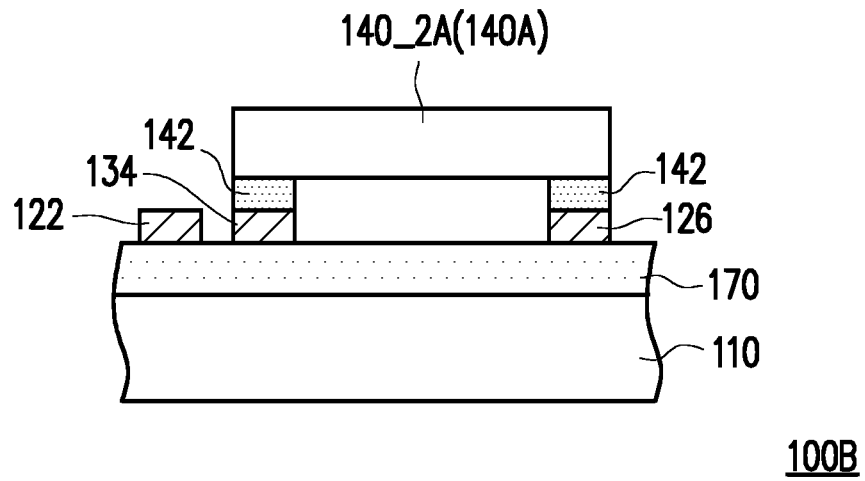
FIG. 8A and FIG. 8B are respectively schematic cross-sectional views of the pixel structure in FIG. 7 taken along line E-E' and line F-F'.
Figure 8B:
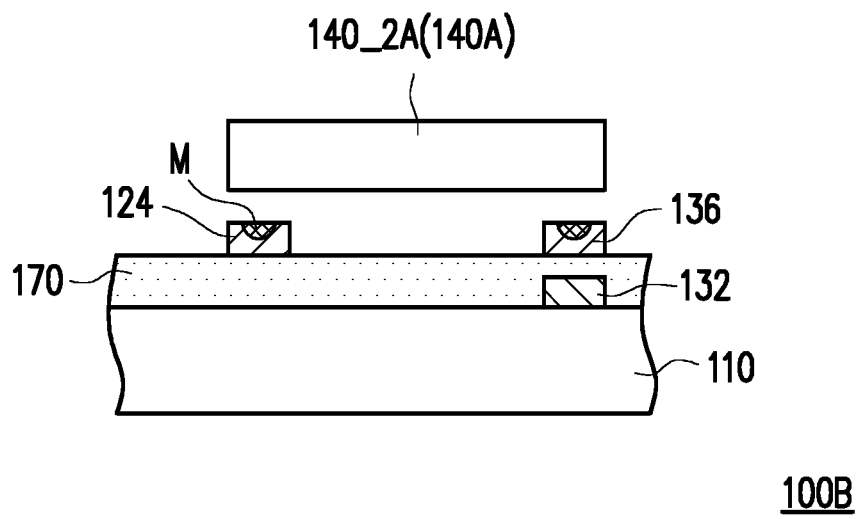

FIG. 7 is a schematic top view of part of a pixel structure according to still another embodiment of the invention. FIG. 8A and FIG. 8B are respectively schematic cross-sectional views of the pixel structure in FIG. 7 taken along line E-E' and line F-F'. Refer to FIG. 7 to FIG. 8B. The pixel structure 100B of this embodiment is similar to the pixel structure 100A shown in FIG. 5. The difference lies in that, in this embodiment, the dies 140A are square. Specifically, in this embodiment, the dies 140A cover the first branch portions 124, the second branch portions 126, the third branch portions 134, and the fourth branch portions 136. Therefore, in the pixel structure 100B after repair, the original dies 140_1A, 140_3A and the repair die 140_2A remain the same appearance, and the connection residue M left on the first conductor 120 and the second conductor 130 may be covered and hidden.

Figure 9:
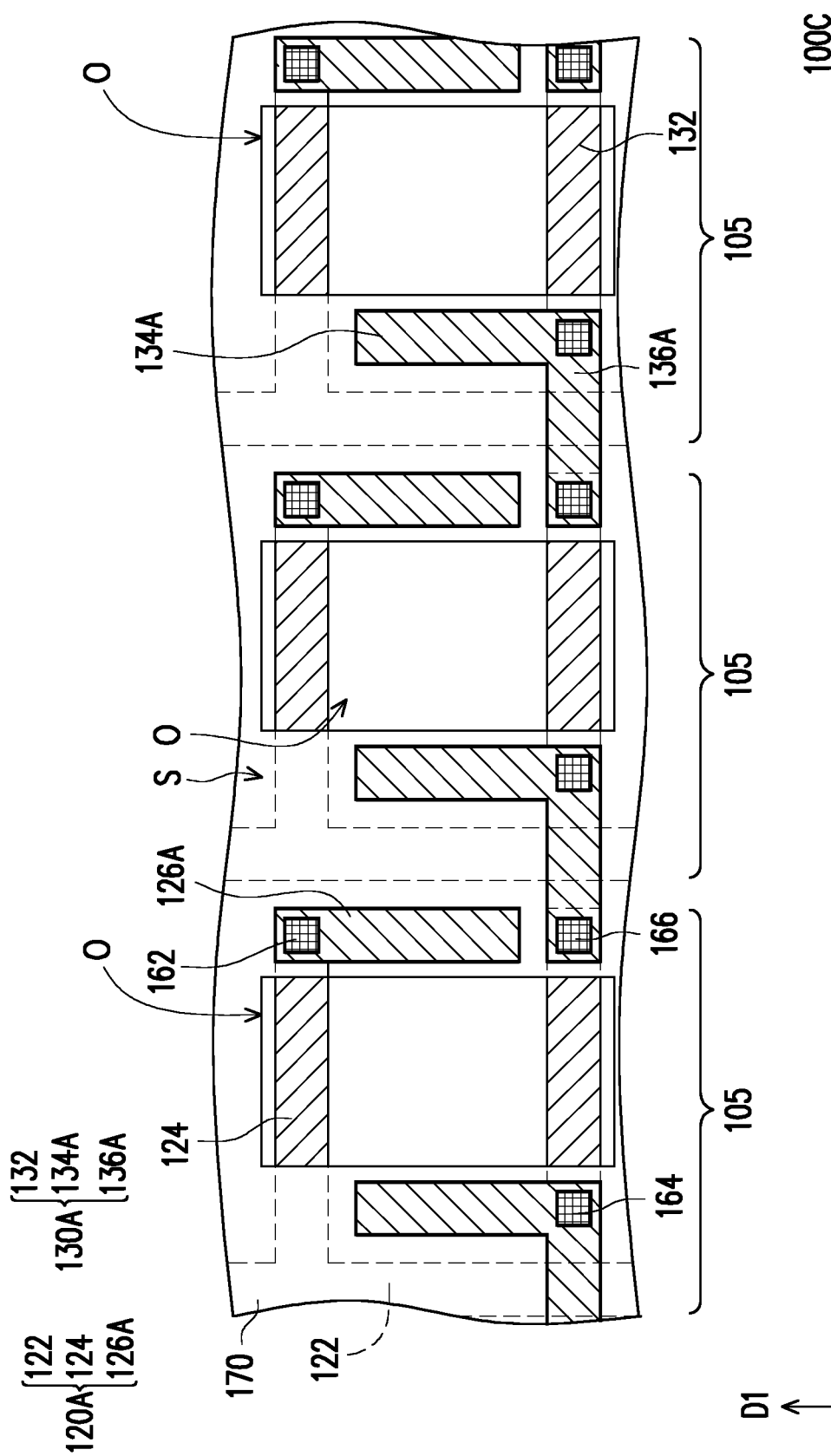
FIG. 9 is a schematic top view of part of a pixel structure according to still another embodiment of the invention.
Figure 10:
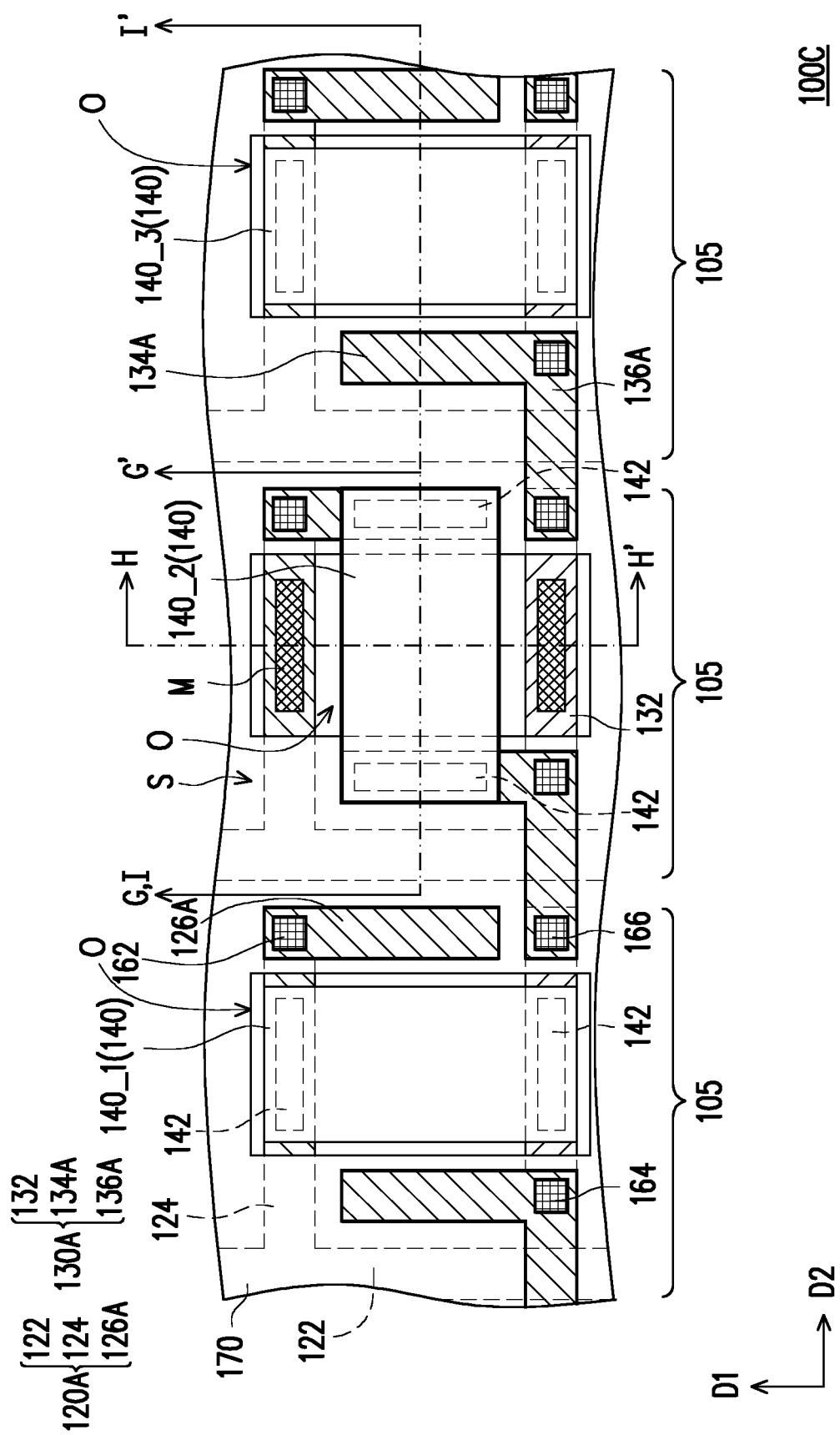
FIG. 10 is another schematic top view of part of the pixel structure in FIG. 9.
Figure 11A:
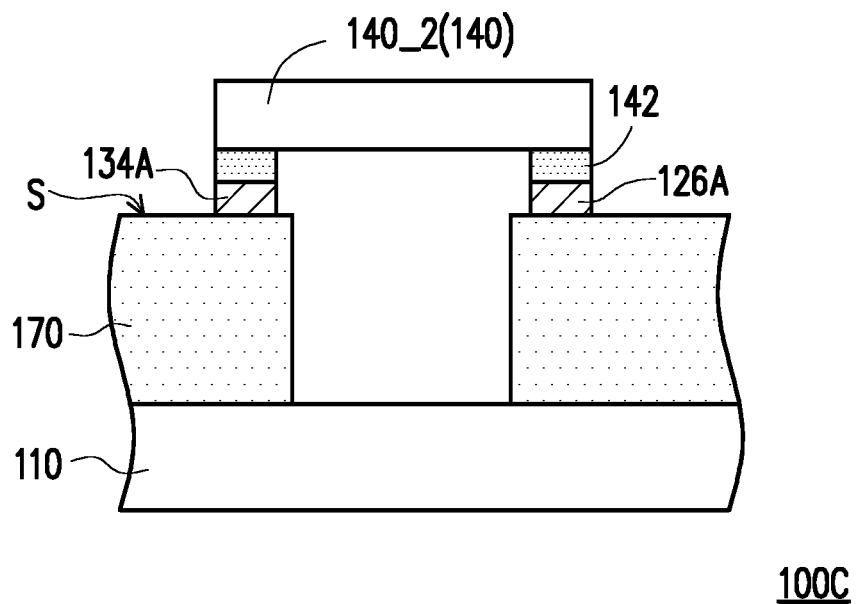
FIG. 11A and FIG. 11B are respectively schematic cross-sectional views of the pixel structure in FIG. 10 taken along line G-G' and line H-H'.
Figure 11B:
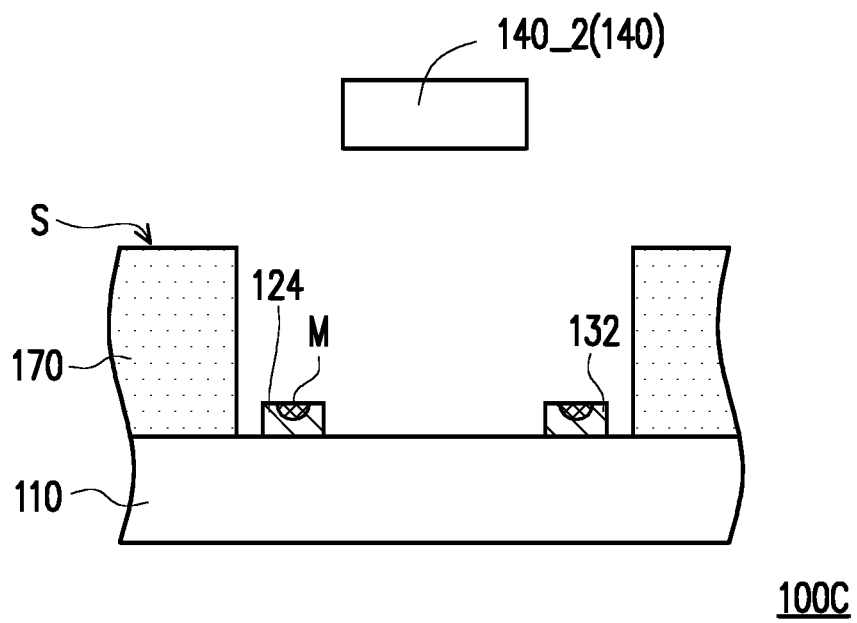

FIG. 9 is a schematic diagram of part of a pixel structure according to still another embodiment of the invention. FIG. 10 is another schematic top view of part of the pixel structure in FIG. 9. FIG. 11A and FIG. 11B are respectively schematic cross-sectional views of the pixel structure in FIG. 10 taken along line G-G' and line H-H'. Refer to FIG. 9 to FIG. 11B. The dies 140 are hidden in the pixel structure 100C in FIG. 9, and the dies 140 are shown in the pixel structure 100C in FIG. 10. The pixel structure 100C of this embodiment is similar to the pixel structure 100 shown in FIG. 1. The difference lies in that, in this embodiment, the pixel structure 100C further includes a dielectric protective layer 170 disposed on the substrate 110. In some embodiments, a top surface S of the dielectric protective layer 170 is higher than light emitting surfaces of the die 140_1 and the die 140_3, and the top surface S of the dielectric protective layer 170 is lower than a light emitting surface of the die 140_2. The dielectric protective layer 170 has a plurality of openings O, and the second branch portions 126A of the first conductor 120A and the third branch portions 134A of the second conductor 130A are disposed on the top surface S of the dielectric protective layer 170. Specifically, the pixel structure 100C further includes a plurality of first conductive through-holes 162 and a plurality of second conductive through-holes 164, where the first conductive through-holes 162 are connected between the first branch portions 124 and the second branch portions 126A, and the second conductive through-holes 164 are connected between the second body portions 132 and the third branch portions 134A.

In addition, in this embodiment, the second conductor 130A further includes a plurality of fourth branch portions 136A extending along the second direction D2. Specifically, the fourth branch portions 136A are respectively connected between neighboring second body portions 132 in the second direction D2. The fourth branch portions 136A crisscross the first body portions 122, and the fourth branch portions 136A are insulated from the first body portions 122. Specifically, the fourth branch portions 136A are connected to the second body portions 132 through the second conductive through-holes 164 and the third conductive through-holes 166. In this embodiment, a function of the fourth branch portions 136A is equal to a function of the bridging portions 150 in the embodiment shown in FIG. 1.

In other words, the first body portions 122, the first branch portions 124, and the second body portions 132 are on the first layer (that is, the lower layer) and in the dielectric protective layer 170. The second branch portions 126A, the third branch portions 134A, and the fourth branch portions 136A are on the second layer (that is, the upper layer) and on the top surface S of the dielectric protective layer 170. The dielectric protective layer 170 covers the first body portions 122 and part of the first branch portions 124 of the first conductor 120A and part of the second body portions 132 of the second conductor 130A, where part of the first branch portions 124 and part of the second body portions 132 are exposed to the openings O, so that the dies 140 can be disposed in the openings O to be connected to the first branch portions 124 and the second body portions 132, as shown in FIG. 11B.

On the other hand, in the pixel structure 100C after repair, the original first dies (that is, the dies 140_1 and 140_3) are on the first layer, and the repair second die (that is, the die 140_2) is on the second layer, as shown in FIG. 11A. In other embodiments, the original first dies (that is, the dies 140_1 and 140_3) are on the second layer (that is, the upper layer), and the repair second die (that is, the die 140_2) is on the first layer (that is, the lower layer), and the invention is not limited thereto. In other words, the first dies and the second die are stacked on the substrate 110. Therefore, when a die 140 in the pixel structure 100D needs to be repaired, by using a two-way extension and two-layer design of the first conductor 120A and the second conductor 130A, the original die 140 can be removed, and the repair die 140 can be installed on the first conductor 120A and the second conductor 130A at the same position on a different layer in another connection mode, so that a cost for producing a large number of dies is saved, and the display effect before and after repair remains consistent.

Figure 11C:
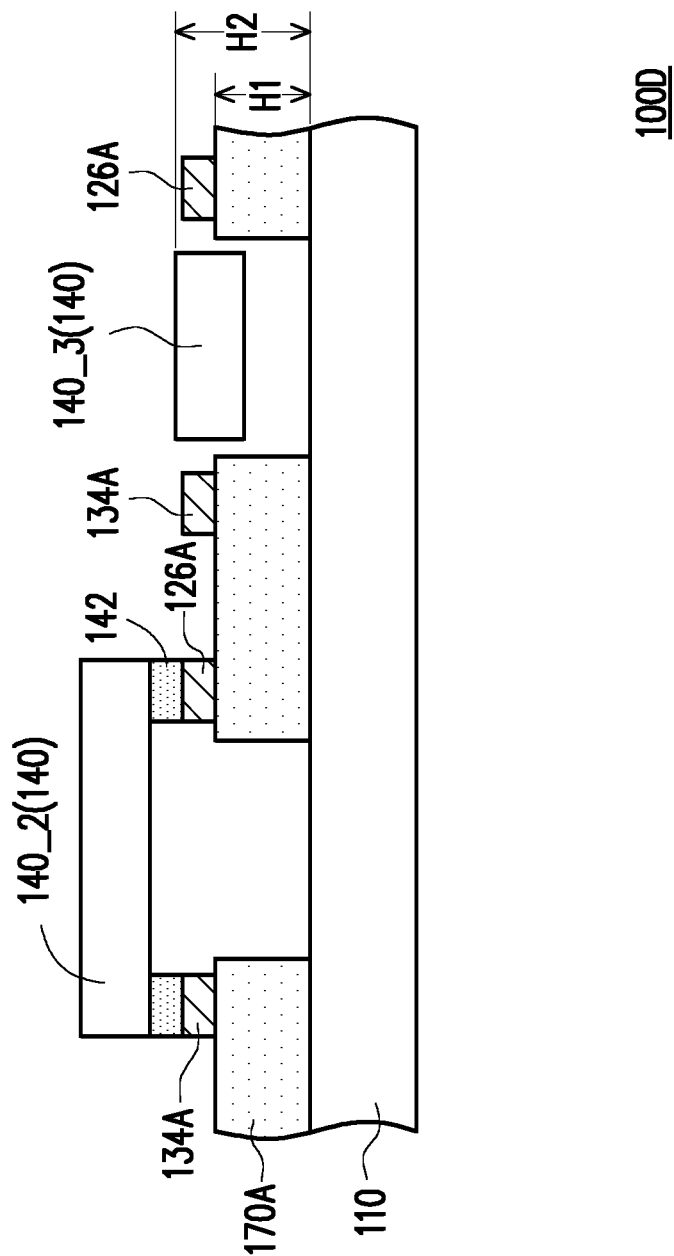
FIG. 11C is a schematic cross-sectional view of part of the pixel structure taken along line I-I' in FIG. 10 according to still another embodiment of the invention.

FIG. 11C is a schematic cross-sectional view of part of the pixel structure taken along line I-I' in FIG. 10 according to still another embodiment of the invention. Refer to FIG. 11C. The pixel structure 100D of this embodiment is similar to the pixel structure 100C shown in FIG. 11A. The difference lies in that, in this embodiment, a height H1 of the top surface S of a dielectric protective layer 170A of the pixel structure 100C to the substrate 110 is less than a height H2 of the light emitting surface of the dies 140 to the substrate 110. In other words, the top surface S of the dielectric protective layer 170A may be lower than the light emitting surface of the dies 140. Therefore, a volume occupied by the pixel structure 100D can be further saved, and the display effect before and after repair remains consistent.

Figure 12:
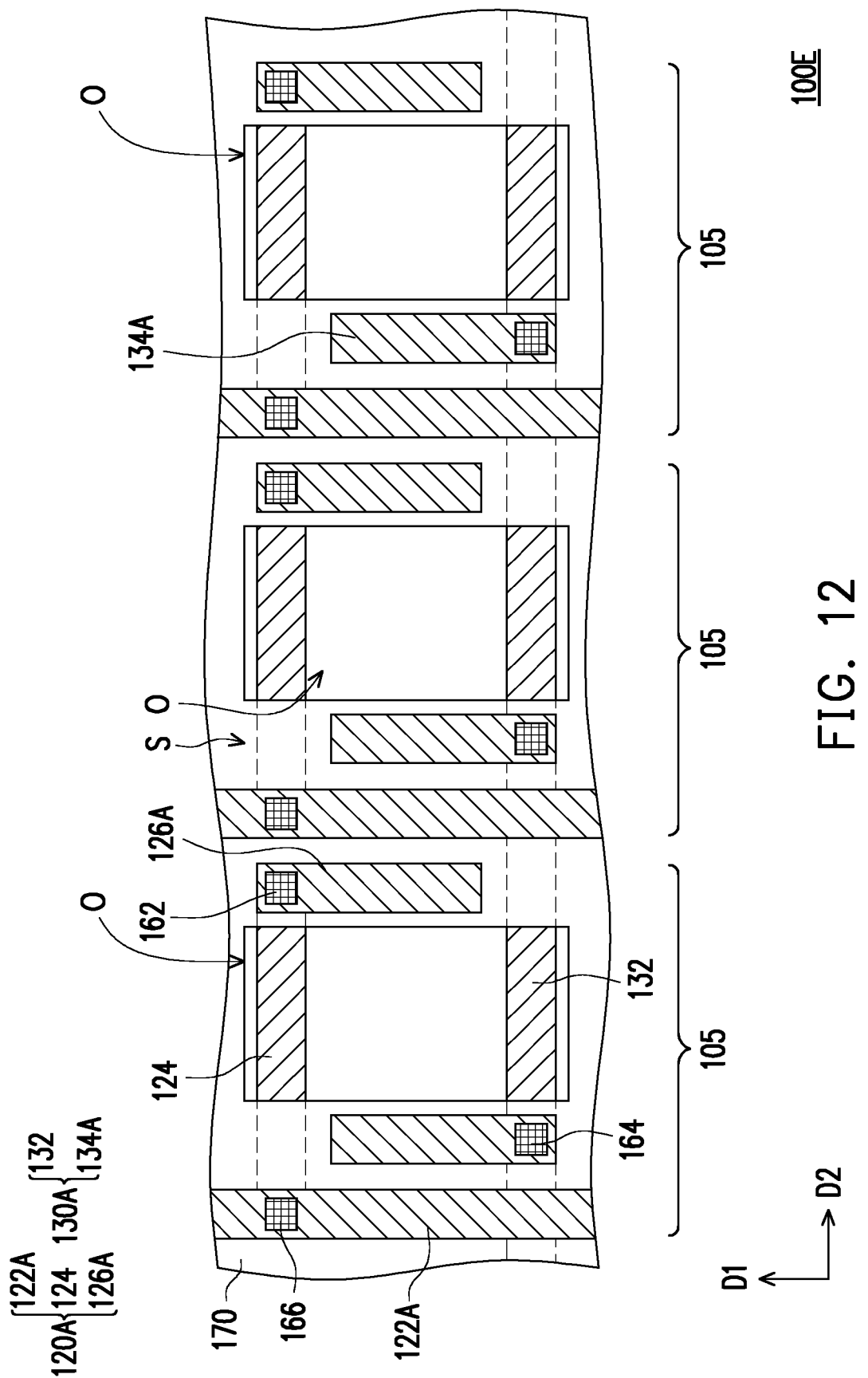
FIG. 12 is a schematic top view of part of a pixel structure according to still another embodiment of the invention.
Figure 13:
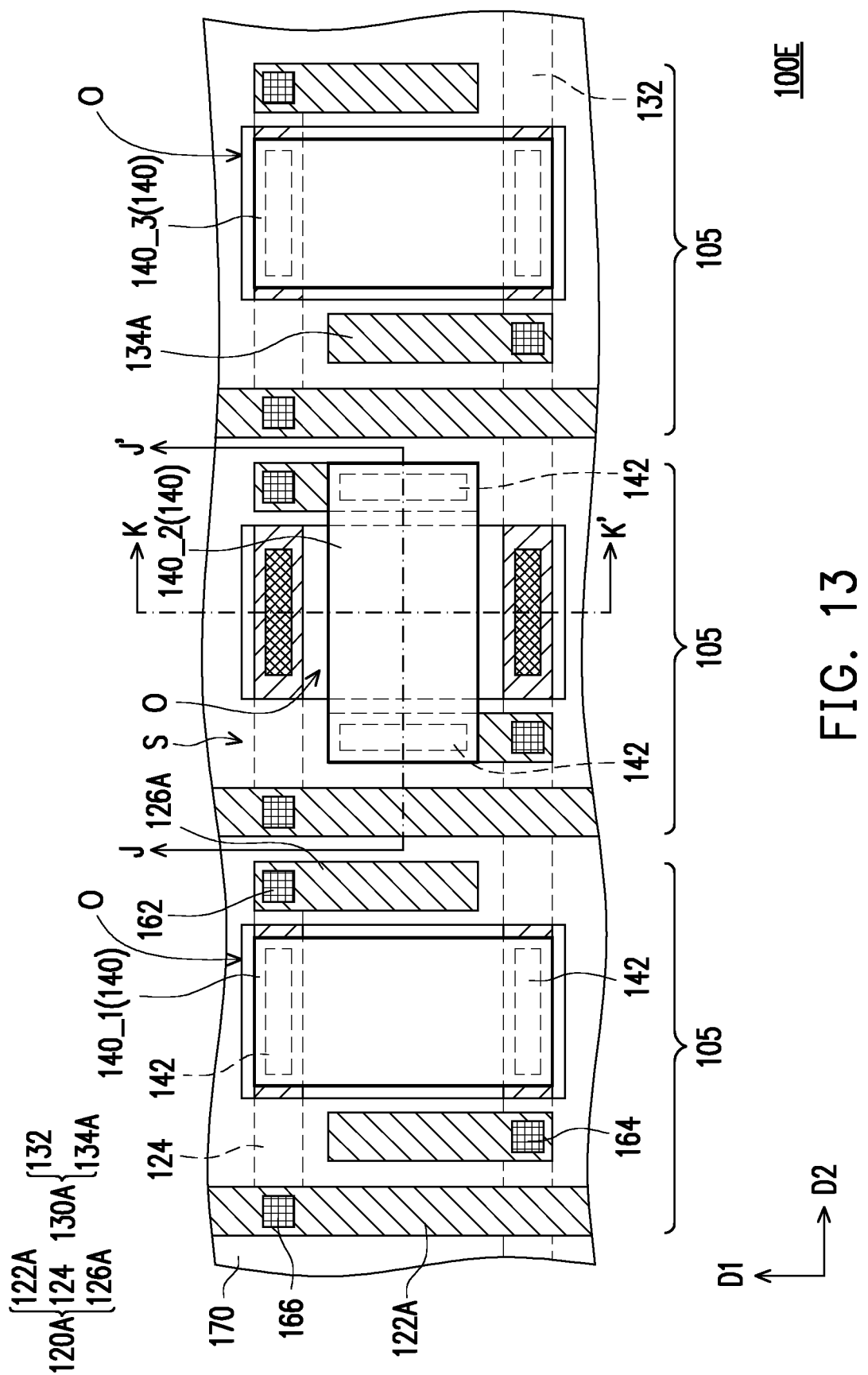
FIG. 13 is another schematic top view of part of the pixel structure in FIG. 12.
Figure 14A:
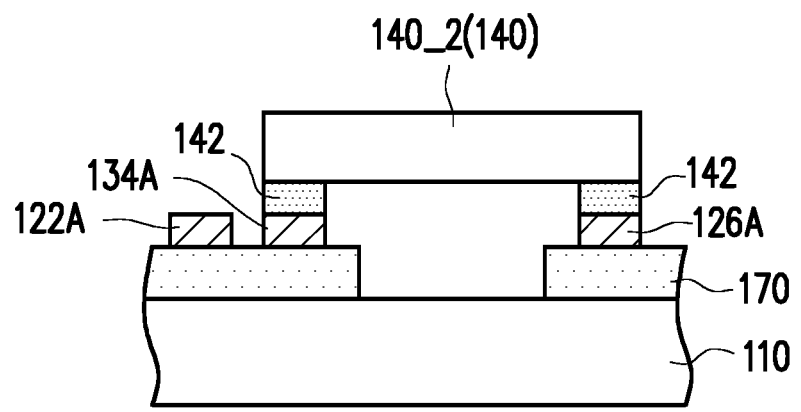
FIG. 14A and FIG. 14B are respectively schematic cross-sectional views of the pixel structure in FIG. 13 taken along line J-J' and line K-K'.
Figure 14B:
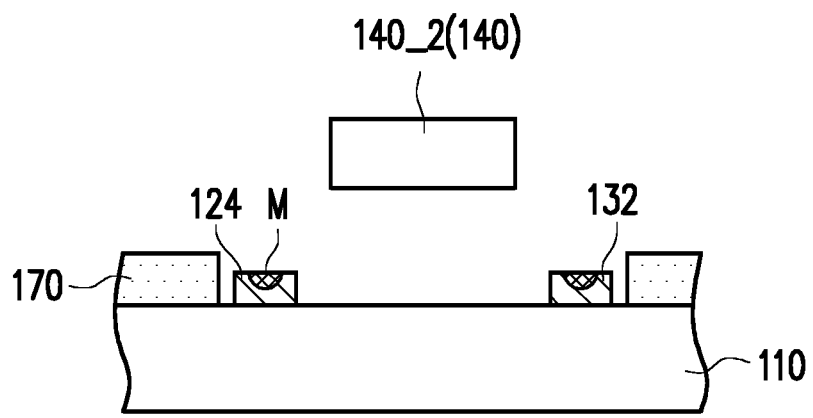

FIG. 12 is a schematic top view of part of a pixel structure according to still another embodiment of the invention. FIG. 13 is another schematic top view of part of the pixel structure in FIG. 12. FIG. 14A and FIG. 14B are respectively schematic cross-sectional views of the pixel structure in FIG. 13 taken along line J-J' and line K-K'. Refer to FIG. 12 to FIG. 14B. The dies 140 are hidden in the pixel structure 100E in FIG. 12, and the dies 140 are shown in the pixel structure 100E in FIG. 13. The pixel structure 100E of this embodiment is similar to the pixel structure 100C shown in FIG. 9. The difference lies that, in this embodiment, the first body portions 122A of the first conductor 120A are disposed on the dielectric protective layer 170, and the second body portions 132 of the second conductor 130A are disposed in the dielectric protective layer 170. In other words, the first conductor 120A and the second conductor 130A may be electrically insulated by using the dielectric protective layer 170.

Specifically, the first branch portions 124 of the first conductor 120A are disposed on the first layer (that is, the lower layer), are connected to the first body portions 122A through the third conductive through-holes 166, and extend along the second direction D2. The second branch portions 126A of the first conductor 120A are disposed on the second layer (that is, the upper layer), are connected to the first branch portions 124 through the first conductive through-holes 162, and extend along the first direction D1. The third branch portions 134A of the second conductor 130A are disposed on the second layer, and are connected to the second body portions 132 through the second conductive through-holes 164. Therefore, when a die 140 in the pixel structure 100E needs to be patched, by using a two-way extension design of the first conductor 120A and the second conductor 130A, the original die 140 can be removed, and the repair die 140 (that is, the die 140_2 shown in FIG. 13) can be installed on the first conductor 120A and the second conductor 130A at the same position in another connection mode, so that a cost for producing a large number of dies is saved, and the display effect before and after repair remains consistent.

Persons of ordinary skill in the art, based on actual requirements, can adjust the circuit designs of all of the foregoing embodiments (that is, the first conductor, the second conductor, the bridging portions, and the conductive through-holes) in terms of their extending directions and patterns (for example, a shape, a length, and/or a width), or change a thickness of conductor contacts, and the invention is not limited thereto.

Based on the foregoing, in the pixel structure of the invention, the first conductor includes a plurality of first body portions extending along a first direction, a plurality of first branch portions extending along a second direction, and a plurality of second branch portions extending along the first direction. The second conductor includes a plurality of second body portions extending along the second direction and a plurality of third branch portions extending along the first direction. Therefore, when a die in the pixel structure needs to be repaired, by using a two-way extension design of the first conductor and the second conductor, the original die can be removed, and the repair die can be installed on the first conductor and the second conductor at the same position in another connection mode, so that a cost for producing a large number of dies is saved, and the display effect before and after repair remains consistent.

Although the invention has been disclosed by the foregoing embodiments, it is not limited thereto. Some variations and modifications can be made by persons of ordinary skill in the art without departing from the spirit and scope of the invention. Therefore, the protection scope of the invention should be subject to the scope defined by the appended claims.

What is claimed is:

1. A pixel structure, comprising:
   a substrate;
   a first conductor, disposed on the substrate, comprising a plurality of first body portions extending along a first direction, a plurality of first branch portions extending along a second direction, and a plurality of second branch portions extending along the first direction, wherein the first direction is different from the second direction;
   a second conductor, disposed on the substrate, comprising a plurality of second body portions extending along the second direction and a plurality of third branch portions extending along the first direction; and
   a plurality of dies, the die comprising two electrodes, wherein the first branch portions are connected between the first body portions and the second branch portions, and the two electrodes of the die are respectively connected to the first branch portions and the second body portions or are respectively connected to the second branch portions and the third branch portions.

2. The pixel structure according to claim 1, wherein the first conductor and the second conductor are on the same layer.

3. The pixel structure according to claim 2, further comprising:
   a plurality of bridging portions, respectively connected between neighboring second body portions in the second direction, wherein the bridging portions criss-cross the first body portions, the bridging portions are insulated from the first body portions, and the bridging portions and the second conductor are on different layers.

4. The pixel structure according to claim 3, further comprising:
   a plurality of conductive through-holes, connected between the bridging portions and the second body portions.

5. The pixel structure according to claim 1, wherein the first branch portions and the second body portions are on the same layer, and the second branch portions and the third branch portions are on the same layer.

6. The pixel structure according to claim 5, wherein the dies comprise a plurality of first dies and a plurality of second dies, wherein the first dies are on a first layer and the second dies are on a second layer.

7. The pixel structure according to claim 5, further comprising:
   a plurality of first conductive through-holes, connected between the first branch portions and the second branch portions; and
   a plurality of second conductive through-holes, connected between the second body portions and the third branch portions.

8. The pixel structure according to claim 7, further comprising:
   a plurality of bridging portions, respectively connected between neighboring second body portions in the second direction, wherein the bridging portions criss-cross the first body portions and the bridging portions are insulated from the first body portions.

9. The pixel structure according to claim 8, wherein the bridging portions are connected to the second body portions through the second conductive through-holes.

10. The pixel structure according to claim 5, further comprising:
    a dielectric protective layer, disposed on the substrate, wherein the dielectric protective layer has a plurality of openings, and the second branch portions and the third branch portions are disposed on a top surface of the dielectric protective layer.

11. The pixel structure according to claim 10, wherein a height from the top surface of the dielectric protective layer to the substrate is less than a height from a light emitting surface of the dies to the substrate.

12. The pixel structure according to claim 1, wherein the dies cover the second body portions, the first branch portions, the second branch portions, and the third branch portions.

13. The pixel structure according to claim 1, wherein connection residue exists on the first branch portions and the second body portions or connection residue exists on the second branch portions and the third branch portions.

14. A pixel structure, comprising:
    a substrate;
    a conductive pattern, comprising a first conductor and a second conductor;
    at least one first die, the at least one first die comprising a first electrode pair respectively connected to the first conductor and the second conductor; and
    at least one second die, the at least one second die comprising a second electrode pair respectively connected to the first conductor and the second conductor, wherein the first electrode pair is arranged along a first direction, the second electrode pair is arranged along a second direction, and the first direction is different from the second direction,
    wherein the first conductor is disposed on the substrate and comprises a plurality first body portions extending along the first direction, a plurality of first branch portions extending along the second direction, and a plurality of second branch portions extending along the first direction; the second conductor is disposed on the substrate and comprises a plurality of second body portions extending along the second direction and a plurality of third branch portions extending along the first direction.

15. The pixel structure according to claim 14, wherein the at least one first die and the at least one second die are stacked on or arranged side by side on the substrate.

* * * * *